United States Patent
Yun et al.

(10) Patent No.: US 10,394,115 B2
(45) Date of Patent: Aug. 27, 2019

(54) METHOD FOR VERIFYING MASK DATA IN COMPUTING DEVICE

(71) Applicant: SAMSUNG ELECTRONICS CO., LTD., Suwon-si, Gyeonggi-Do (KR)

(72) Inventors: Dong-Kil Yun, Yongin-si (KR); Sunghoon Kim, Seongnam-si (KR); Jae-Eun Lee, Hwaseong-si (KR); Hyangja Yang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 175 days.

(21) Appl. No.: 15/442,780

(22) Filed: Feb. 27, 2017

(65) Prior Publication Data
US 2017/0293219 A1    Oct. 12, 2017

(30) Foreign Application Priority Data

Apr. 12, 2016  (KR) .................. 10-2016-0044907

(51) Int. Cl.
*G03F 1/36* (2012.01)
*G06F 17/50* (2006.01)

(52) U.S. Cl.
CPC ............ *G03F 1/36* (2013.01); *G06F 17/5081* (2013.01)

(58) Field of Classification Search
CPC ............................... G03F 1/36; G06F 17/5081
See application file for complete search history.

(56) References Cited

U.S. PATENT DOCUMENTS

| | | | |
|---|---|---|---|
| 7,275,227 B1 | 9/2007 | Ying | |
| 7,284,214 B2 * | 10/2007 | LeBritton | G06F 17/5081 716/52 |
| 7,325,222 B2 | 1/2008 | Strelkova et al. | |
| 7,475,383 B2 * | 1/2009 | Suh | G03F 1/36 378/35 |
| 7,546,564 B2 | 6/2009 | Moon | |
| 7,552,408 B2 | 6/2009 | Teh et al. | |
| 7,646,906 B2 | 1/2010 | Saidin et al. | |
| 7,765,515 B2 | 7/2010 | Ying | |
| 7,827,520 B2 | 11/2010 | Choi | |
| 7,882,480 B2 * | 2/2011 | Ye | G03F 1/36 716/53 |
| 7,995,199 B2 * | 8/2011 | Hess | G03F 1/84 356/237.2 |
| 8,930,857 B2 | 1/2015 | Taoka | |
| 9,147,035 B1 | 9/2015 | Huang et al. | |
| 9,317,645 B2 * | 4/2016 | Hamouda | G06F 17/5072 |
| 9,747,401 B2 * | 8/2017 | Hamouda | G06F 17/5072 |
| 2006/0090146 A1 * | 4/2006 | LeBritton | G06F 17/5081 716/52 |
| 2008/0077907 A1 * | 3/2008 | Kulkami | G03F 1/36 716/53 |
| 2013/0298094 A1 * | 11/2013 | Chen | G06F 17/5081 716/112 |

* cited by examiner

*Primary Examiner* — Naum Levin
(74) *Attorney, Agent, or Firm* — Volentine, Whitt & Francos, PLLC (57) ABSTRACT

A method for verifying mask data in a computing device includes receiving layout data, receiving mask data, determining an interaction number between a pattern corresponding to the layout data and a pattern corresponding to the mask data, and detecting an error of the mask data based on the interaction number.

10 Claims, 8 Drawing Sheets

| | Layout data | Mask data | DRC Output |
|---|---|---|---|
| Mask Data Not Generation | | | |
| Mask Data Dummy Generation | | | |
| Mask Data Open | | | |
| Mask Data Short | | | |

METHOD FOR VERIFYING MASK DATA IN COMPUTING DEVICE

CROSS-REFERENCE TO RELATED APPLICATIONS

This U.S. non-provisional patent application claims priority under 35 U.S.C. § 119 to Korean Patent Application No. 10-2016-0044907, filed on Apr. 12, 2016 in the Korean Intellectual Property Office, the entire contents of which are hereby incorporated by reference.

BACKGROUND

1. Technical Field

The present disclosure relates to verifying mask data.

2. Background Information

A schematic circuit is created using a schematic tool to design a semiconductor integrated circuit. The schematic circuit includes representations of devices and connection relationships between the devices in the semiconductor integrated circuit. The devices represented in the schematic circuit of the semiconductor integrated circuit are designed as patterns of material layers such as a conductive layer, a semiconductor layer and an insulating layer. After that, a layout is designed, and then a photomask is generated. In the layout design, each pattern is vertically and horizontally disposed. A photolithography process is performed based on the layout design. In the photolithography process, each material layer is deposited and patterned. The photolithography process results in generating (manufacturing) a semiconductor integrated circuit with the operational characteristics desired for the purposes of the designer who designs the semiconductor integrated circuit.

Basic operational characteristics of devices are decided by design rules used for the layout design. Such design rules may include parameters for a space between devices, a minimum line width of conductive lines, an extended region, and an area, and these parameters are defined in the design rules. For example, a definition of a gate length of a transistor is mostly determined by a design rule. In the case where a wanted operational characteristic cannot be obtained only by a parameter defined in a design rule, an option for adjusting the parameter may be provided for the semiconductor integrated circuit. For example, when a wanted operational characteristic of a transistor cannot be obtained due to a gate length defined in a design rule, an option for adjusting the gate length may be provided as a characteristic for the transistor.

There have been many efforts for increasing the integration of semiconductor devices to increase capacity of the semiconductor devices and reduce manufacturing costs. The integration of semiconductor devices is one of the most important factors that decides the price of the products. Since the integration of semiconductor devices greatly depends on an area occupied by a unit cell, it is very important to effectively design a layout of the semiconductor device. Since designing a layout of a semiconductor device using a layout design tool needs a lot of time and trial and error, it is also important to reduce a layout design time.

SUMMARY

Example embodiments of the present disclosure provide a method for verifying mask data in a computing device. The method may include receiving layout data, receiving mask data, determining an interaction number representative of overlap between a pattern corresponding to the layout data and a pattern corresponding to the mask data, and detecting an error of the mask data based on the interaction number.

Example embodiments of the present disclosure also provide a method of verifying mask data. The method may include obtaining layout data, obtaining optical proximity corrected (OPCed) layout data obtained by performing an optical proximity correction on the layout data, obtaining mask data, determining whether a scattering bar exists in the mask data, when the scattering bar does not exist in the mask data, determining whether an interaction occurs once between a pattern corresponding to the optical proximity corrected layout data and a pattern corresponding to the mask data once, and when as a determination result, the interaction does not occur once, detecting an error of the mask data.

BRIEF DESCRIPTION OF THE FIGURES

Embodiments of the present disclosure will be described below in more detail with reference to the accompanying drawings. The embodiments of the present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art. Like numbers refer to like elements throughout.

DETAILED DESCRIPTION OF THE EMBODIMENTS

Embodiments of the present disclosure will be described more fully hereinafter with reference to the accompanying drawings, in which embodiments of the present disclosure are shown. The concepts described herein may, however, be embodied in many different forms and should not be construed as limited to the embodiments set forth herein. Rather, these embodiments are provided so that this disclosure will be thorough and complete, and will fully convey the scope of the concepts described herein to those skilled in the art.

In the drawings, the size and relative sizes of layers and regions may be exaggerated for clarity. Like numbers refer to like elements throughout.

Figure 1:
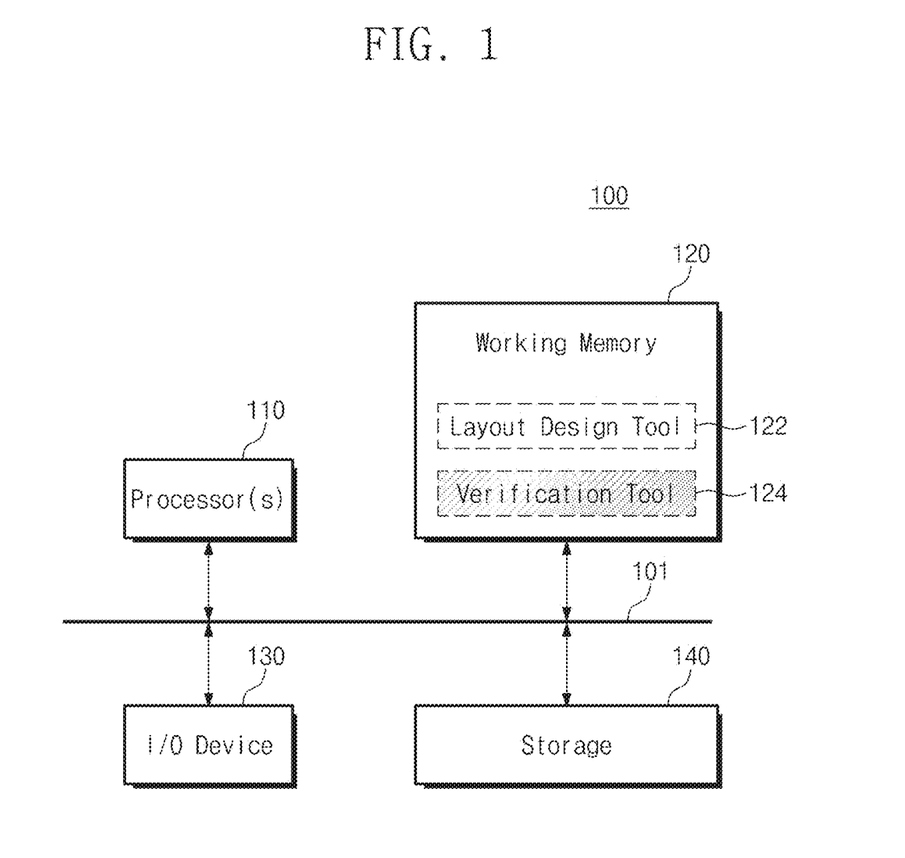
FIG. 1 is a block diagram illustrating a computing system for generating a layout according to example embodiments of the present disclosure.

FIG. 1 is a block diagram illustrating a computing system for generating a layout according to example embodiments of the present disclosure. Referring to FIG. 1, a computing device 100 may include at least one processor 110, a working memory 120, an input/output device 130, and a storage device 140. The computing device 100 may be provided as a device dedicated solely for designing a layout. The computing device 100 may be configured to drive (store and execute) one or more design and verification simulation programs.

The processor 110 may execute software (e.g., an application program, an operating system (OS), device drivers) in/on the computing device 100. The processor 110 may execute an operating system (OS) loaded into the working memory 120. The processor 110 may execute a variety of application programs (AP) on an operating system basis. For example, the processor 110 may execute a layout design tool 122 loaded into the working memory 120.

The working memory 120 may load an operating system (OS) or application programs. At a boot time of the computing device 100, an OS image (not illustrated) stored in the storage device 140 may be loaded into the working memory 120 according to a booting sequence. All input/output operations of the computing device 100 may be supported by an operating system (OS). The layout design tool 122 for a layout design may also be loaded from the storage device 140 into the working memory 120.

The layout design tool 122 may include a biasing function capable of changing a form and a location of patterns of a specific layout differently from those defined by a design rule. A mask layout design tool for generating a mask layout may also be loaded into the working memory 120 by processing optical proximity corrected layout patterns on the basis of a mask tooling specification. The mask layout design tool may compare designed layout patterns and mask layout patterns. On the basis of a comparison result, the mask layout design tool may modify a pattern having an error among the mask layout patterns.

A verification tool 124 may verify a layout pattern or a mask layout pattern. In example embodiments, the verification tool 124 may perform a design rule check (DRC) under a changed biasing data condition. The verification tool 124 may compare and verify mask data and layout data using an interaction concept. The interaction may mean that the mask layout pattern meets the layout pattern. For example, interaction may be identified by a number of overlaps between the mask layout pattern and layout pattern. The number of overlaps may be determined, for example, by the overlapping area, the non-overlapping area, the number of independent contiguous areas that overlap or do not overlap, or the number of different times that edges intersect without being substantially parallel.

A simulation tool that performs an optical proximity correction (OPC) with respect to designed layout patterns may be further loaded into the working memory 120. The working memory 120 may include a volatile memory such as a static random access memory (SRAM) or a dynamic random access memory (DRAM). However, the working memory 120 is not limited thereto and may include a nonvolatile memory such as a phase-change RAM (PRAM), a magnetic RAM (MRAM), a resistance RAM (ReRAM), a ferroelectric RAM (FRAM), a flash memory, etc.

The input/output device 130 controls (e.g., receives/sends) an input and an output of a user from user interface devices. For example, the input/output device 130 may include a keyboard or a monitor to obtain information from a designer. The information may be obtained by receiving input, or by using input to generate output. A designer may obtain information about a semiconductor region or data paths that require an adjusted operation characteristic using the input/output device 130. A processing process and a processing result of a simulation tool may be displayed through the input/output device 130.

The storage device 140 may be provided as a storage medium of the computing device 100. The storage device 140 may store application programs (AP), an operating system image, and all sorts of data. The storage device 140 may be provided as a memory card (e.g., a multi media card (MMC), an embedded MMC (eMMC), a secure digital (SD)), or a hard disk drive (HDD). The storage device 140 may include a NAND type flash memory that has a mass storage function. The storage device 140 may include a next generation nonvolatile memory such as a PRAM, a MRAM, a ReRAM, a FRAM, etc. or a NOR flash memory.

A system bus 101 may provide a network inside the computing device 100. The at least one processor 110, the working memory 120, the input/output device 150, and the storage device 140 may be electrically connected to one another and may exchange data with one another through the system bus 101.

A mask pattern verification operation may be performed by comparing layout data and mask data using an interaction concept of the computing device 100 according to example embodiments of the present disclosure.

Figure 2:
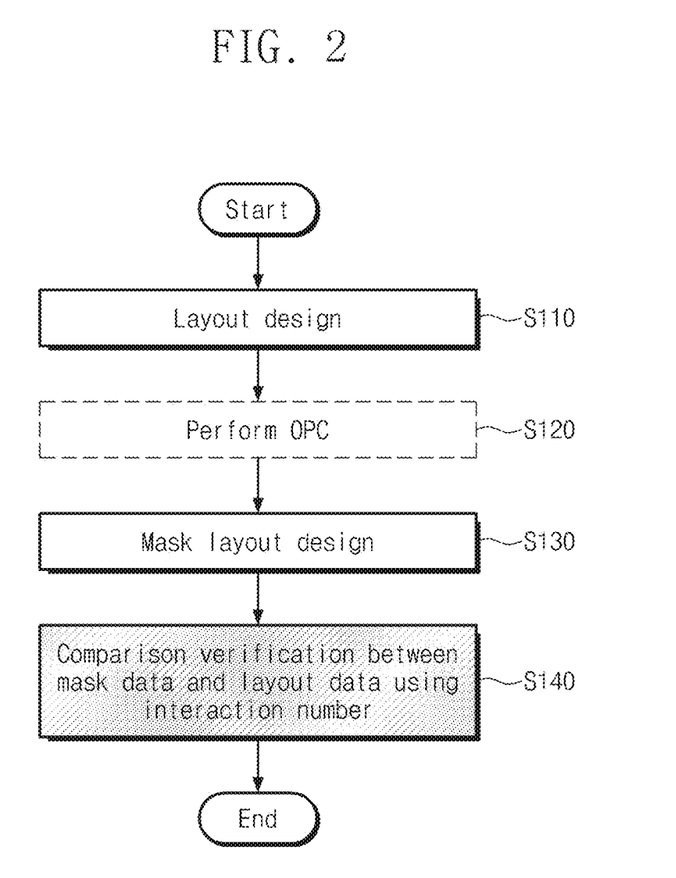
FIG. 2 is a flowchart illustrating a method of designing a mask according to example embodiments of the present disclosure.

FIG. 2 is a flowchart illustrating a method of designing a mask according to example embodiments of the present disclosure. Referring to FIG. 2, the method of designing a mask is as follows.

A high level design (HLD) of a semiconductor integrated circuit may be performed using the computing device 100. The high level design (HLD) means that a design target integrated circuit is described by a high level language of a computer language. For example, a high level language like a C language may be used. Circuits designed by a high level design may be more specifically expressed by a register transfer level (RTL) coding or a simulation. A code generated by the register transfer level (RTL) coding may be converted into a netlist to be synthesized to the whole semiconductor integrated circuit. A synthetic schematic circuit is verified by a simulation tool and an adjustment process may be accompanied depending on a verification result.

A layout design for embodying a logically completed semiconductor integrated circuit on a silicon substrate is performed. For example, a layout design may be performed with reference to a schematic circuit synthesized in a high level design or a netlist corresponding thereto (S110). The layout design may include a routing procedure of disposing and connecting various cells provided from a cell library according to a design rule.

A cell library for a layout design may include information about an operation, a speed, and power consumption of a cell. A cell library for expressing a circuit of a specific gate level as a layout may be defined in layout design tool 122. A layout is a process for defining a form and a size of a pattern for configuring transistors and gates to be actually formed on silicon.

For example, to actually form an inverter circuit on silicon, a layout pattern such as a PMOS, an NMOS, an N-well, a gate line, etc. has to be drawn. To this end, what is best for it may be selected among inverters already defined in a cell library. Routing may be performed with respect to selected and disposed cells. Most processes involved in layout design can be automatically or manually performed by the layout design tool 122.

After the routing, a verification may be performed on the layout to determine whether a part against a design rule exists using the verification tool 124. Examples of items being verified may include a design rule check (DRC) for checking whether a layout fits the design rule, an electronical rule check (ERC) for checking whether an electrical disconnection exists within the layout, and a layout versus schematic (LVS) for checking whether the layout coincides with a gate level netlist.

Thereafter, an optical proximity correction (OPC) process is performed (S120). Optical proximity correction is used for correcting a distortion phenomenon of a photolithographic process which draws a mask made through a layout design in a substrate. That is, optical proximity correction technology is for correcting a distortion phenomenon such as refraction or a process effect generated due to a characteristic of light in a light exposure operation using a layout pattern. A layout pattern may be formed on a semiconductor substrate by performing a photolithography process. The process of performing the optical proximity correction may mean a process of changing a layout by correcting an error due to a light proximity effect.

After that, the layout design tool 122 may design a mask layout based on the layout pattern changed by the optical proximity correction (S130). The mask layout design is to process the layout pattern changed by the optical proximity correction to print it on an actual silicon wafer substrate.

The verification tool 124 may perform a comparison verification operation between mask data and layout data using an interaction number (S140). The interaction number may be the number of times or an amount by which a pattern corresponding to the mask pattern and a pattern corresponding to the layout data overlap each other. Thereafter, a photomask may be made using mask data where the comparison verification is completed.

The mask data verification method according to example embodiments may check a design rule of the mask data using the interact concept. For example, the mask data verification method may determine whether or not an error exists by pass/fail by checking whether the layout data interacts with the mask data only once. That is, in the case where the layout data does not interact with the mask data, it is determined as a pattern loss and an error may occur. In the case where the layout data interacts with the mask data one or more times, the mask data may be determined as an open error.

In the case where the mask data does not interact with the layout data, it may be determined as a dummy pattern generation and an error may occur. When the mask data interacts with the layout data one or more times, the mask data may be determined as a short error.

Figure 3:
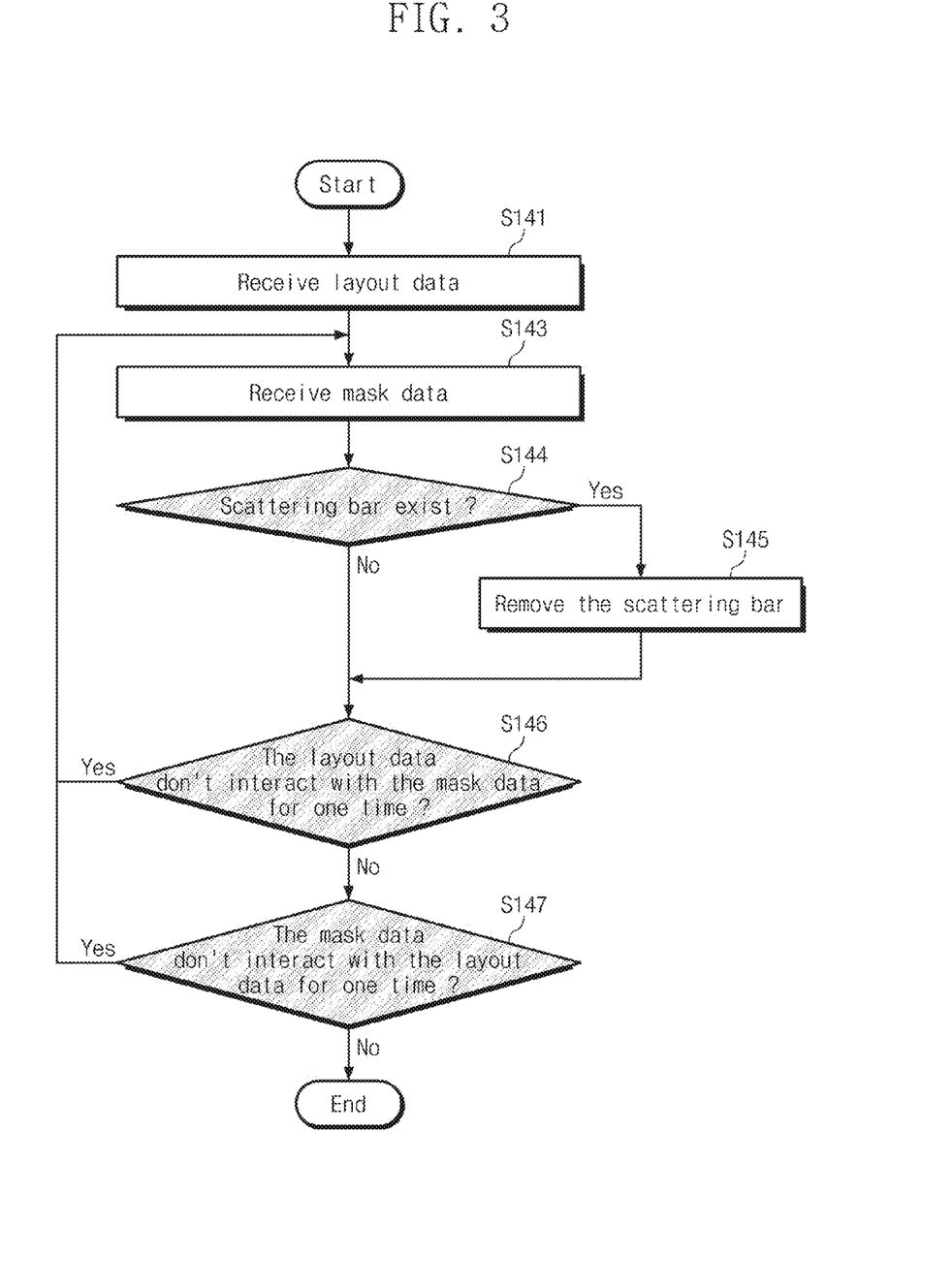
FIG. 3 is a drawing illustrating a method of verifying mask data according to an embodiment of the present disclosure.

FIG. 3 is a drawing illustrating a method of verifying mask data according to an embodiment of the present disclosure. Referring to FIGS. 1 through 3, a verification method with respect to the mask data is as follows.

Layout data may be obtained (S141). The layout data may be obtained by receiving the layout data, or by generating layout data from received input. Thereafter, mask data corresponding to the layout data may be obtained (S143). Mask data may be obtained by receiving the mask data, or by generating mask data from received input. After that, it may be determined whether a scattering bar exists in the mask data (S144). A scattering bar is a feature placed on a mask next to isolated or semi-isolated features to help the isolated or semi-isolated features form similar to how dense features form. A scattering bar is a sub-resolution assist feature (SRAF). Isolated and semi-isolated features in/on a mask include metal lines, trenches, or gate. The scattering bar helps ensure the isolated or semi-isolated features print on a substrate properly without a so-called isolated/dense proximity effect.

In the case where the scattering bar exists in the mask data (S144=Yes), the scattering bar is removed (S145) and an operation S146 proceeds. In the case where the scattering bar does not exist in the mask data (S144=No), the operation S146 proceeds.

It may be determined whether the layout data ("comparison target data") does not interact with the mask data ("comparison reference data") once (S146). In the case where the layout data does not interact with the mask data once (i.e., the layout data does not interact with the mask data even once or the layout data interacts with the mask data twice or more times) (S146=Yes), the operation S143 may proceed once more. In the case where the layout data interacts with the mask data once (S146=No), a verification operation with reference to the mask data may be completed.

In the case where the layout data ("comparison target data") interacts with the mask data ("comparison reference data") once (S146=No), it may be determined whether the mask data does not interact with the layout data (comparison reference data) once (S147). In the case where the mask data does not interact with the layout data once (S147=Yes), the operation S143 may proceed once more. In the case where the mask data interacts with the layout data once (S147=No), a verification operation with reference to the layout data may be completed and the process of FIG. 3. ends. The order of the operation S146 and the operation S147 may be changed.

In example embodiments, a verification method of the mask data may be a design rule check (DRC). A design rule considers a process technology for a mask generation such as a minimum size with respect to all masks needed in a given process and a space between peripheral layers. A layout has to be designed according to a design rule and the design rule check is a process of checking a part which is against the design rule by a mistake of a designer and pointing out a wrong part.

The mask data described in FIG. 3 is generated in response to the layout data. However, generation of the mask data is not limited thereto. The mask data may be generated based on the optical proximity corrected layout data that experienced the optical proximity correction process.

Figure 4:
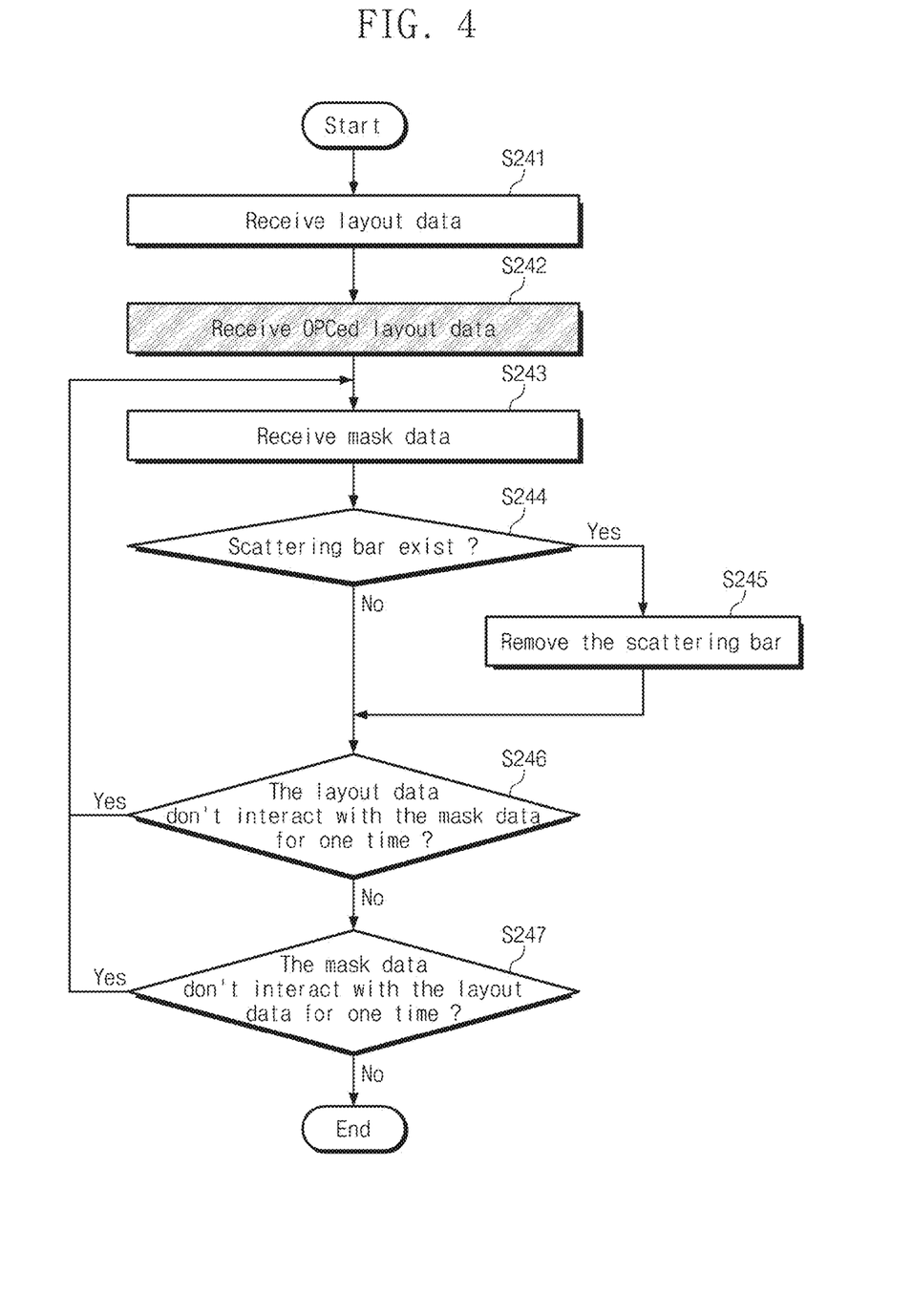
FIG. 4 is a drawing illustrating a method of verifying mask data according to another embodiment of the present disclosure.

FIG. 4 is a drawing illustrating a method of verifying mask data according to another embodiment of the present disclosure. referring to FIGS. 1 through 4, a verification method with respect to the mask data may further include an operation S242 as comparison with that of FIG. 3. In the operation S242, the OPCed layout data may be obtained (generated) by performing the optical proximity correction with respect to the layout data. The remaining operations (S214, S243, S244, S245, S246, and S247) may be the same as or similar operationally and/or in sequence to those with corresponding numbers (S114, S143, S144, S145, S146, and S147) of FIG. 3.

In the case of a mask pattern to be generated in a donut form, when performing a verification operation with respect to an inner hole of the mask data and inner hole of the layout data according to the mask verification method, different types of errors may be detected.

Figure 5:
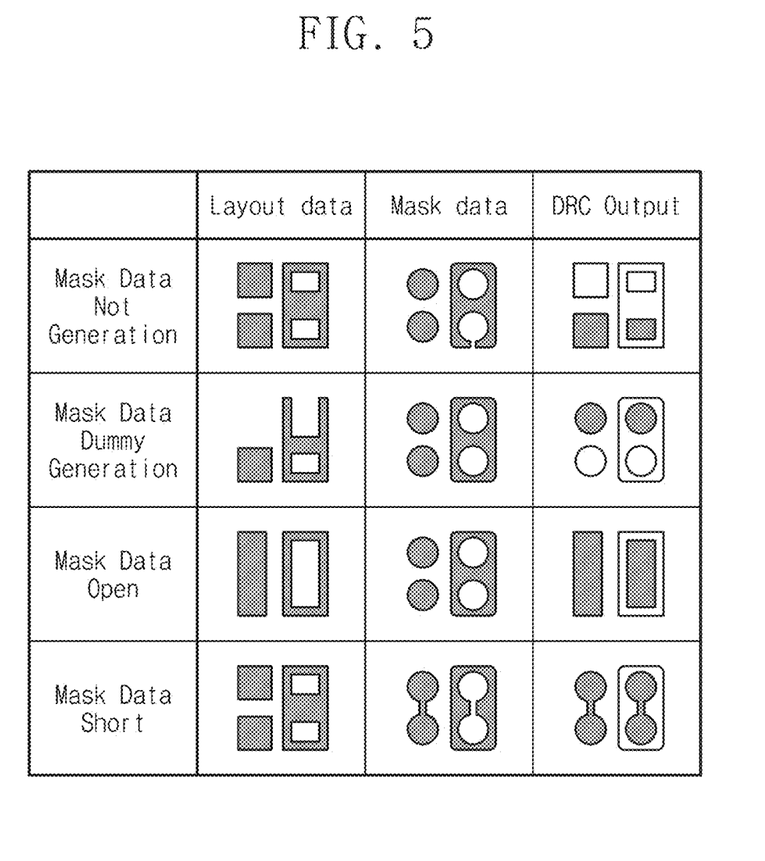
FIG. 5 is a drawing illustrating errors detected according to a method of verifying mask data according to example embodiments of the present disclosure.

FIG. 5 is a drawing illustrating errors detected according to a method of verifying mask data according to example embodiments of the present disclosure. Referring to FIG. 5, different types of errors of a mask pattern having a hole may be detected.

When the layout data does not interact with the mask data, a design rule check may result in output that identifies a pattern loss.

When the layout data interacts with the mask data once, a design rule check may result in output that identifies an open error.

When the mask data does not interact with the layout data, a design rule check may result in output that identifies a dummy pattern.

When the mask data interacts with the layout data once, a design rule check may result in output that identifies a short error.

A layout pattern is corrected during an optical proximity correction process. When the correction is not a simple pattern change but is instead a correction that is excessive enough such that a design rule check results in an output that identifies an error with respect to the mask data compared with an original pattern, the excessive correction is called an overcorrection OPC.

Figure 6:
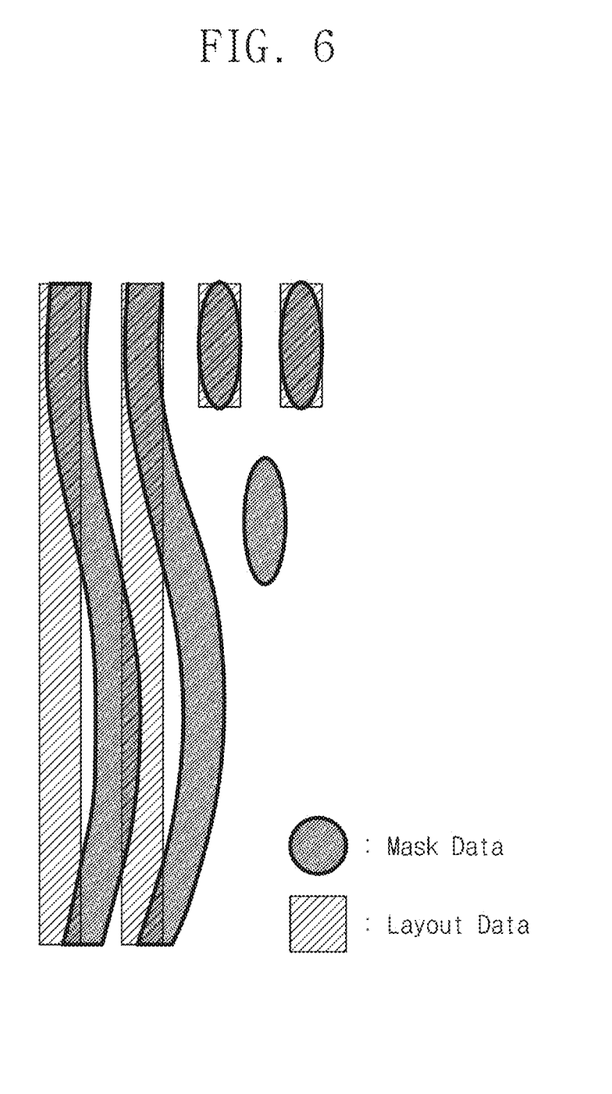
FIG. 6 is a drawing illustrating an overcorrection according to example embodiments of the present disclosure.

FIG. 6 is a drawing illustrating an overcorrection according to example embodiments of the present disclosure. As illustrated in FIG. 6, verification between a mask pattern and a layout pattern may be impossible due to an overcorrection OPC. The mask verification method may be embodied to verify mask data in consideration of the overcorrection OPC.

Figure 7:
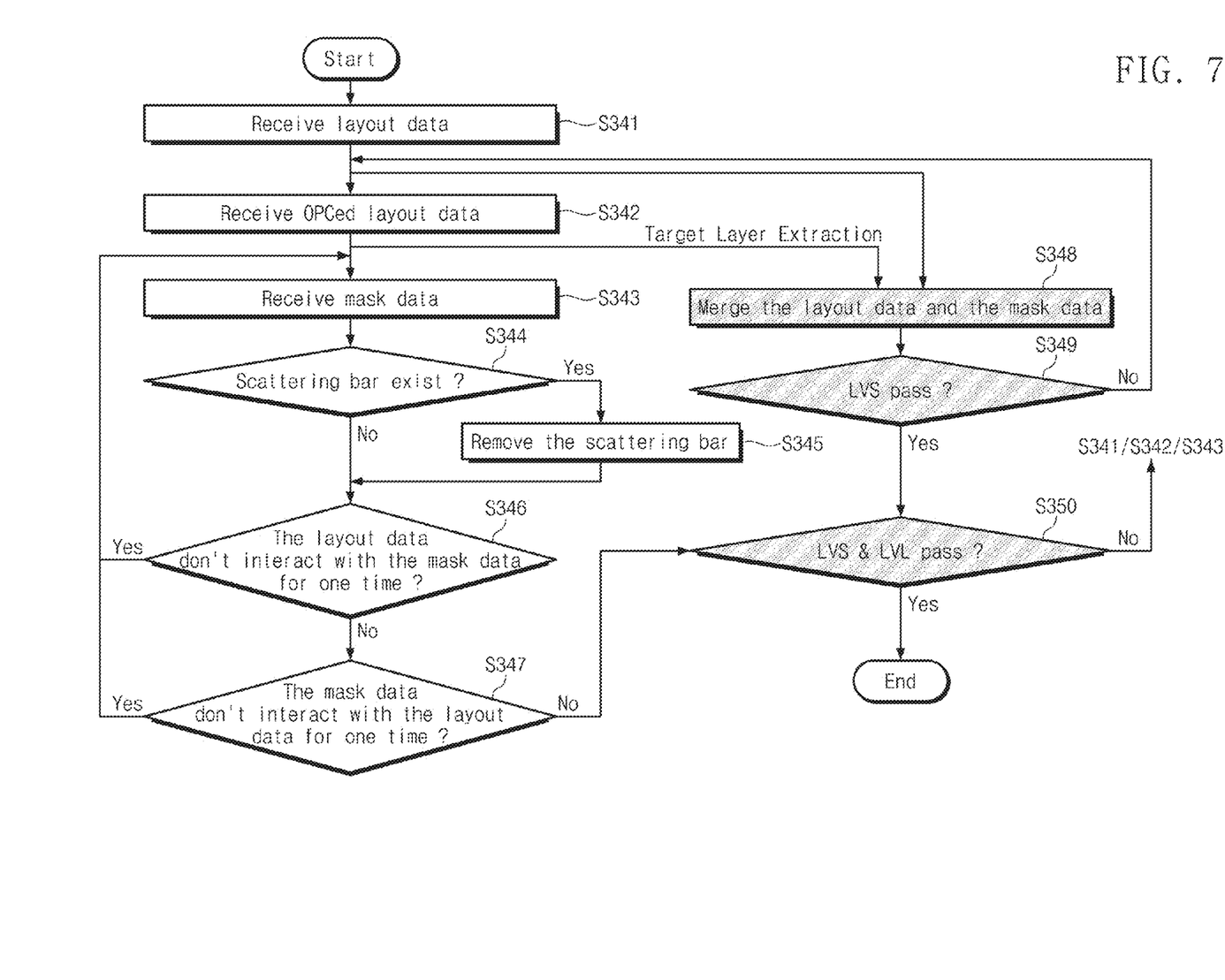
FIG. 7 is a drawing illustrating a method of verifying mask data considering an overcorrection.

FIG. 7 is a drawing of showing a method of verifying mask data considering an overcorrection. Referring to FIGS. 1 through 7, the method of verifying mask data may add operations S348, S349 and S350 in comparison with those of FIG. 4. Through a design error, a difference may be found in a netlist extracted through a schematic design of a circuit (i.e., that is planned) and a netlist extracted from a layout. This means that when an actual device comes out, an operation like a simulation cannot be guaranteed. The cause may be found in a layout. Thus, a verification process for correcting the error is needed and this process is called a layout versus schematic (LVS) verification.

In an operation S348, layout data and optical proximity corrected layout data are merged. For example, new layout data for verifying a mask may be generated by extracting a target layer from the optical proximity corrected layout data and merging the extracted target layer with a corresponding layer of the layout data.

In an operation S349, the layout versus schematic (LVS) verification is performed and it is determined whether an error exists as a verification result. When an error does not exist (S349=Yes), an operation S350 may proceed. When an error exists (S349=No), the procedure returns to the operation S342 and the optical proximity corrected layout data may be corrected.

In the operation S350, LVS and layer versus layer (LVL) verifications are performed. When the verification is passed (S350=Yes), a verification operation for a mask pattern is finished. When the verification is failed (S350=No, the procedure goes to one of the operations S341, S342 and S343.

In the method of verifying mask data according to example embodiments of the present disclosure, an unintended error caused by an overcorrection may be avoided by changing data corresponding to a specific layer in the optical proximity corrected layout data into corresponding data of the original layout data and then verifying the changed layout data.

In the case where the mask data is for a via mask layer, in an operation S346, it may be verified whether via layout data interacts with upper/lower metal mask data once.

Figure 8:
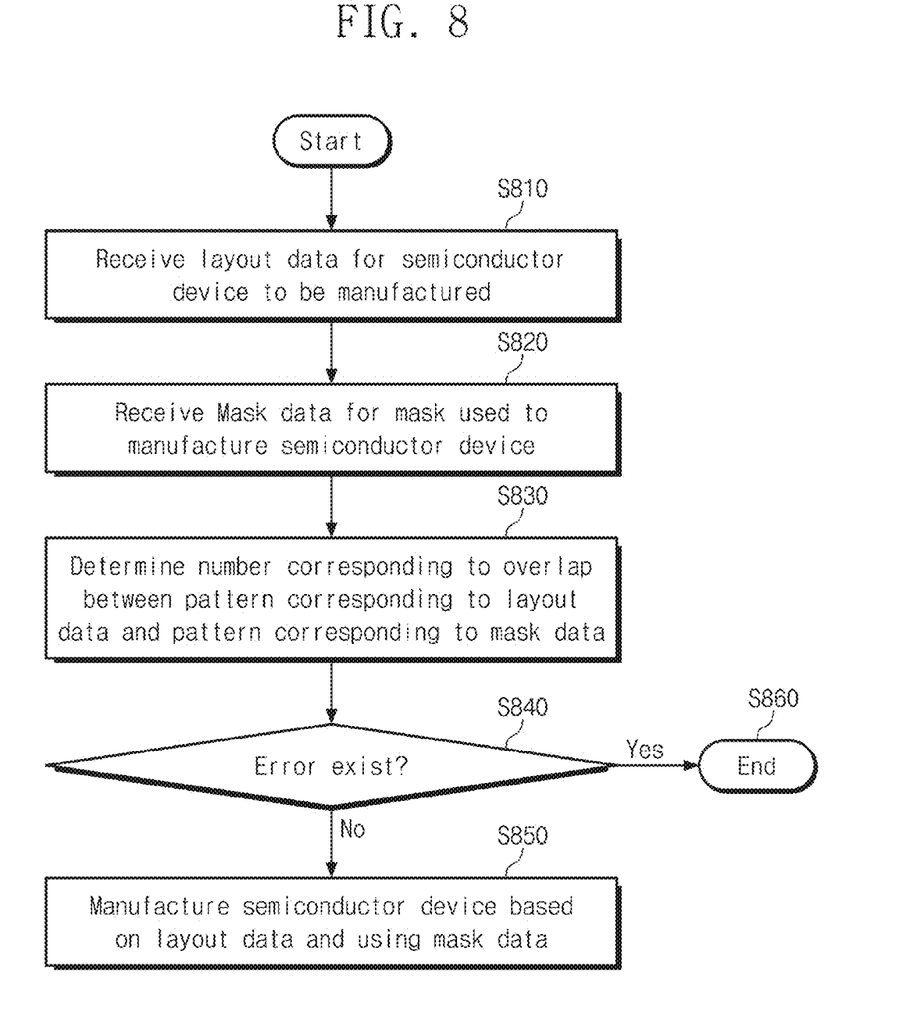
FIG. 8 is a method of manufacturing a semiconductor integrated circuit based on verifying mask data according to an embodiment of the present disclosure.

FIG. 8 is a drawing illustrating a method of manufacturing a semiconductor integrated circuit based on verifying mask data according to an embodiment of the present disclosure. The process in FIG. 8 begins when layout data is obtained (received) for a semiconductor device at S810. At S820, mask data is obtained (received) for a mask. The mask is one proposed to be used to manufacture the semiconductor device.

At S830, a number corresponding to overlap is determined. The overlap is between a pattern corresponding to the layout data and a pattern corresponding to the mask data. At S840, a determination is made as to whether an error exists based on the number determined at S830. If an error exists (S840=Yes), the process ends at S860. Of course, the process may merely return to correct any error that is identified. If no error is found (S850=No), the semiconductor device is manufactured based on the layout data and using the mask data. The semiconductor device may be manufactured using a mask corresponding to the mask data.

Indeed, in a process related to FIG. 8, a photomask may be made using the mask data when an error of the mask data is not identified based on the number corresponding to overlap. The photomask is then used in manufacturing the semiconductor device. Additionally, the process may include identifying whether a scattering bar exists in the mask data and, when the scattering bar exists in the mask data, removing the scattering bar. Moreover, as described for embodiments herein, the process may also include optical proximity correcting the layout data, such that the optical proximity corrected layout data is used to determine the number corresponding to overlap between the pattern corresponding to the layout data and the pattern corresponding to the mask data.

In the case where the mask data is for a via mask layer, in an operation S347, it may be verified whether via mask data interacts with upper/lower metal layout data once.

The remaining operations (S341, S342, S343, S344, S345, S346, and S347) may be the same as or similar operationally and/or in sequence to those (S241, S242, S243, S244, S245, S246, and S247) of FIG. 4.

The method of verifying mask data according to example embodiments of the present disclosure, when layout data and mask data exist, may determine whether an error exists based on whether the layout data interacts with the mask data and the number of times the layout data interacts with the mask data.

When the layout data interacts with the mask data only once, a mask verification operation may be passed. Except for that, all operations may be processed as an error. The same is true with the hole pattern. When the mask data interacts with the layout data only once, a mask verification operation may be passed. Except for that, all operations may be processed as an error. The same is true with the hole pattern.

When the via mask data interacts with the upper metal layout data only once, a mask verification operation may be passed. Except for that, all operations may be processed as an error. When the via mask data interacts with the lower metal layout data only once, a mask verification operation may be passed. Except for that, all operations may be processed as an error. When the upper metal layout data interacts with the via mask data only once, a mask verification operation may be passed. Except for that, all operations may be processed as an error. When the lower metal layout data interacts with the via mask data only once, a mask verification operation may be passed. Except for that, all operations may be processed as an error.

The method of verifying mask data may be performed according to other example embodiments of the present disclosure. For example, layout data, OPCed layout data obtained by performing an OPC on the layout data, and mask data may all present in an embodiment. The method of verifying mask data may be performed by comparing the layout data before the OPC and the OPCed layout data after the OPC, and comparing the OPCed layout data and the mask data.

When the optical proximity corrected layout data interacts with the mask data only once, a mask verification operation may be passed. Except for that, all operations may be processed as an error. The same is true with the hole pattern. When the mask data interacts with the optical proximity corrected layout data only once, a mask verification operation may be passed. Except for that, all operations may be processed as an error. The same is true with the hole pattern. New layout data obtained by substituting specific layers in the optical proximity corrected layout data for specific layers of the layout data may be verified using a schematic and LVS.

The operations with respect to the method of verifying mask data according to example embodiments of the present disclosure may be performed by one or more programmable processors that execute a computer program for performing functions of processing input data or generating input data. The operations may be implemented by a special purpose logical circuit, for example, a field programmable gate array (FPGA) or an application-specific integrated circuit (ASIC).

A computer readable medium may include instructions that activate a device to perform at least some of the methods described above. The computer readable medium may be included in magnetic medium, optical medium, other medium (e.g., a CD-ROM, a hard drive, a read only memory, a flash drive, etc.), or combinations thereof. The computer readable medium may be an article embodied substantially and non-temporarily.

The method of verifying mask data according to example embodiments of the present disclosure may reduce the time taken to make a mask by detecting an error based on the interaction number between layout data and mask data.

Having described the exemplary embodiments of the present disclosure, it is further noted that it is readily apparent to those of reasonable skill in the art that various modifications may be made without departing from the spirit and scope of the inventive concept which is defined by the metes and bounds of the appended claims.

What is claimed is:

1. A method for verifying mask data in a computing device, comprising:
    obtaining layout data for a layout of a semiconductor device;
    obtaining optical proximity corrected (OPCed) layout data obtained by performing an optical proximity correction on the layout data;
    obtaining mask data for a mask used to manufacture the semiconductor device;
    determining whether a scattering bar exists in the mask data;
    when the scattering bar does not exist in the mask data, determining whether an interaction occurs once between a pattern corresponding to the optical proximity corrected layout data and a pattern corresponding to the mask data; and
    when as a determination result, the interaction does not occur once, detecting an error of the mask data.

2. The method of claim 1, when the scattering bar exists in the mask data, further comprising:
    removing the scattering bar from the mask data.

3. The method of claim 1, when as a result of determination, the interaction occurs once, further comprising:
    determining whether the LVS and LVL (layer versus layer) verifications are passed.

4. The method of claim 1, wherein the determining whether an interaction occurs once further comprises:
    determining whether the optical proximity corrected layout data interacts with the mask data once; and
    determining whether the mask data interacts with the optical proximity corrected layout data once.

5. The method of claim 4,
    wherein when the optical proximity corrected layout data interacts with the mask data once and the mask data interacts with the optical proximity corrected layout data once, a verification operation with respect to the mask data is passed.

6. A method for manufacturing a semiconductor device, comprising:
    obtaining layout data for the semiconductor device to be manufactured;
    obtaining mask data for a mask used to manufacture the semiconductor device;
    determining a number corresponding to overlap between a pattern corresponding to the layout data and a pattern corresponding to the mask data;
    identifying whether an error of the mask data exists based on the number corresponding to overlap, and
    manufacturing the semiconductor device based on the layout data and using the mask data when an error of the mask data is not identified based on the number corresponding to overlap.

7. The method for manufacturing a semiconductor device of claim 6, further comprising:
    making the photomask using the mask data when an error of the mask data is not identified based on the number corresponding to overlap.

8. The method for manufacturing a semiconductor device of claim 7,
    wherein the photomask made using the mask data is used in manufacturing the semiconductor device.

9. The method for manufacturing a semiconductor device of claim 6, further comprising:
    identifying whether a scattering bar exists in the mask data and, when the scattering bar exists in the mask data, removing the scattering bar.

10. The method for manufacturing a semiconductor device of claim 6, further comprising:
    optical proximity correcting the layout data,
    wherein the optical proximity corrected layout data is used to determine the number corresponding to overlap between the pattern corresponding to the layout data and the pattern corresponding to the mask data.

* * * * *